United States Patent
Pendharkar et al.

(10) Patent No.: US 7,846,789 B2
(45) Date of Patent: Dec. 7, 2010

(54) ISOLATION TRENCH WITH ROUNDED CORNERS FOR BICMOS PROCESS

(75) Inventors: Sameer P. Pendharkar, Allen, TX (US); John Lin, Chelmsford, MA (US); Philip L. Hower, Concord, MA (US); Steven L. Merchant, Amherst, NH (US)

(73) Assignee: Texas Instruments Incorporated, Dallas, TX (US)

( * ) Notice: Subject to any disclaimer, the term of this patent is extended or adjusted under 35 U.S.C. 154(b) by 177 days.

(21) Appl. No.: 11/873,205

(22) Filed: Oct. 16, 2007

(65) Prior Publication Data

US 2009/0096033 A1 Apr. 16, 2009

(51) Int. Cl.
*H01L 21/8238* (2006.01)

(52) U.S. Cl. .................... 438/202; 438/234; 438/294; 438/296; 438/700; 257/E21.54; 257/E21.642; 257/E21.696

(58) Field of Classification Search .................. 438/202, 438/234, 296, 294, 700; 257/370, E21.696, 257/E27.015, E21.54, E21.642
See application file for complete search history.

(56) References Cited

U.S. PATENT DOCUMENTS

| | | | |
|---|---|---|---|
| 4,490,736 A | 12/1984 | McElroy | |
| 4,994,887 A | 2/1991 | Hutter et al. | |
| 5,338,696 A * | 8/1994 | Ilderem et al. | 438/202 |
| 6,020,621 A | 2/2000 | Wu | |
| 6,271,070 B2 * | 8/2001 | Kotani et al. | 438/207 |
| 6,734,524 B1 | 5/2004 | Parthasarathy et al. | |
| 6,815,780 B1 | 11/2004 | Khemka et al. | |
| 7,411,269 B2 * | 8/2008 | Ma et al. | 257/510 |
| 2006/0246652 A1 * | 11/2006 | Grivna et al. | 438/234 |

OTHER PUBLICATIONS

Kim et al., "A Highly Reliable Trench DMOSFET Employing Self-Align Techinique and Hydrogen Annealing", IEEE Electron Device Letters, vol. 22, Dec. 2001, pp. 594-596.*

Kim, et al., "Highly Reliable Trench DMOSFET Realized by Using Trench Corner Rounding", Journal of the Korean Physical Society, vol. 37, No. 6, Dec. 2000, pp. 882-885.

Parthasarathy, V, et al., "A multi trench analog+logic protection (M-TRAP) for substrate crosstalk prevention in a 0.25/spi mu/m smart power platform with 100V high-side capability," Power Semiconductor Devices and ICs, 2004 Proceedings, ISPSD apos;04, the 16th International Symposium, May 24-27, 2004, pp. 427-430.

* cited by examiner

*Primary Examiner*—Ha Tran T Nguyen
*Assistant Examiner*—Daniel Whalen
(74) *Attorney, Agent, or Firm*—Warren L. Franz; Wade J. Brady, III; Frederick J. Telecky, Jr.

(57) ABSTRACT

A semiconductor device comprising a first transistor device on or in a semiconductor substrate and a second transistor device on or in the substrate. The device further comprises an insulating trench located between the first transistor device and the second transistor device. At least one upper corner of the insulating trench is a rounded corner in a lateral plane of the substrate.

14 Claims, 9 Drawing Sheets

US 7,846,789 B2

ISOLATION TRENCH WITH ROUNDED CORNERS FOR BICMOS PROCESS

TECHNICAL FIELD

The disclosure is directed, in general, to the semiconductor devices, and more specifically, to a semiconductor device having a trench, as well as the manufacture thereof.

BACKGROUND

Semiconductor devices (e.g., integrated circuits) can integrate a number of different components, including different transistor types. For instance, bipolar transistors and metal oxide semiconductor (MOS) transistors (including complementary MOS (CMOS) transistors) can be integrated on a single substrate to form BiCMOS devices. Such integration designs allow one to take advantage of selected properties of the components. E.g., bipolar transistors can be used in some analog operations requiring high speed or greater drive currents, while CMOS transistors can be used in some digital operations requiring low power dissipation. The push to increase transistor density in devices results in a smaller size and closer proximity of transistors.

SUMMARY

The disclosure provides in one embodiment, a semiconductor device, comprising a first transistor device on or in a semiconductor substrate and a second transistor device on or in the substrate. The device further comprises an insulating trench located between the first transistor device and the second transistor device. At least one upper corner of the insulating trench is a rounded corner in a lateral plane of the substrate.

In another embodiment the semiconductor device comprises a bipolar complementary metal oxide semiconductor (BiCMOS) device that includes a metal oxide semiconductor (MOS) transistor, a bipolar transistor and the above-described insulating trench. The transistors are formed in or on a semiconductor layer on a semiconductor substrate. The semiconductor layer and the substrate include a same first dopant type, and a concentration of the first dopant is greater in the substrate than in the semiconductor layer. The insulating trench is located between the MOS transistor and the bipolar transistor, and the insulating trench is formed through the semiconductor layer and a bottom side of the insulating trench ends in the substrate. The device further comprises insulating layers on the substrate and covering the BiCMOS device. The device also comprises interconnects through one or more of the insulating layers to electrically connect MOS transistor and bipolar transistor to each other, or to active or passive components of the semiconductor device.

Another embodiment comprises a method of manufacturing the semiconductor device. The method comprises depositing the above-described semiconductor layer on the semiconductor substrate and forming the BiCMOS device. Forming the BiCMOS device includes forming the first and second transistor devices in or on the semiconductor layer and forming the above-described insulating trench between transistor devices The trench is formed through the semiconductor layer such that a bottom side of the insulating trench ends in the substrate. Forming the device also comprises forming the above-described insulating layers and interconnects.

BRIEF DESCRIPTION OF DRAWINGS

The disclosure is described with reference to example embodiments and to accompanying drawings, wherein.

DETAILED DESCRIPTION

To electrically isolate transistor components on a substrate, an insulating trench is formed between the components laying adjacent to each other on the substrate. The insulating trench is configured to prevent the lateral transfer of electrical carriers (e.g., holes or electrons) between adjacent transistors. The transfer of carriers can result in latch-up phenomenon which can cause the device to not operate properly and in some cases can permanently damage the device.

To deter the formation of cracks in an insulating layer in the trench, top corners of the trench are rounded. Fabricating a trench with at least one rounded top corner deters the formation of cracks or voids in materials deposited in the trench. The formation of cracks or voids in such materials undesirably reduces the trench's ability to prevent the lateral transfer of electrical carriers.

FIGS. 1 to 10 present cross-sectional and plan views of selected steps in a method of manufacturing an example semiconductor device 100 according to the principles of the present disclosure.

Figure 1:
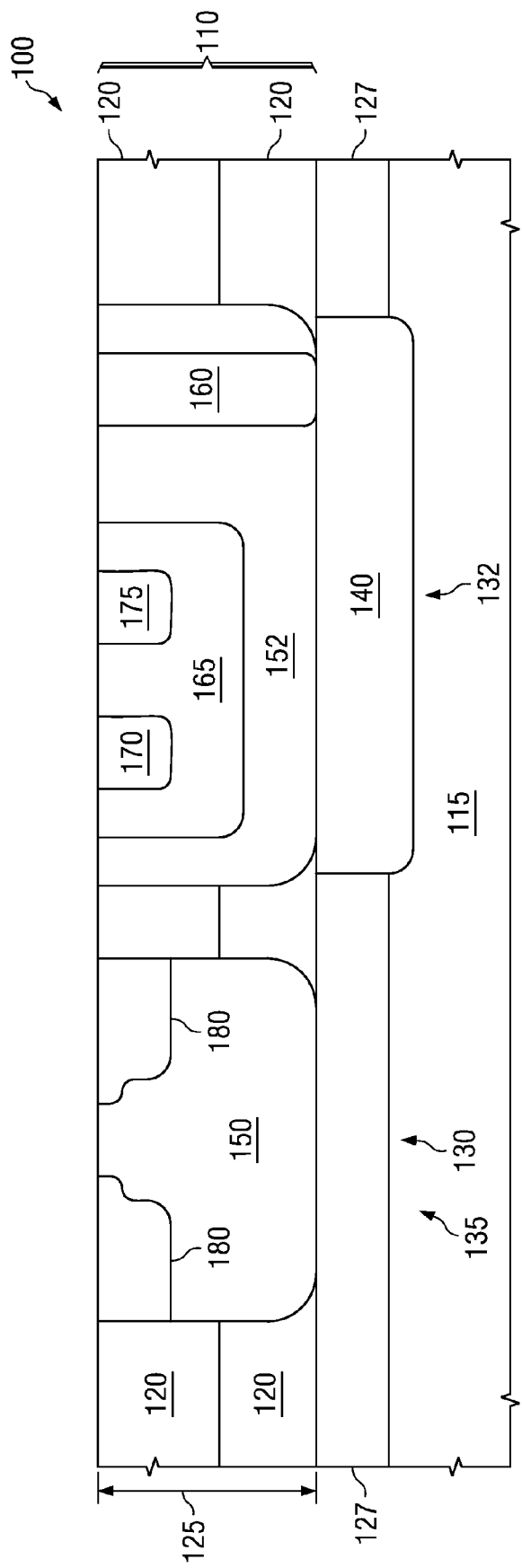
FIGS. 1 to 10 present cross-sectional and plan views of selected steps in a method of manufacturing an example semiconductor device 100 according to the principles of the present disclosure.

FIG. 1 shows a cross-sectional view of the example device 100 after depositing a semiconductor layer 110 on a semiconductor substrate 115 (e.g., silicon wafer). The semiconductor layer 110 can include one or more epitaxially-grown silicon layers 120 on a silicon wafer substrate 115. In some cases, the semiconductor layer 110 has a thickness 125 of about 15 to 30 microns.

The semiconductor layer 110 can be implanted with a first dopant type (e.g., one of an n-type or p-type dopant) followed by a first thermal diffusion process (e.g., at least about 900° C. for at least about 60 minutes). Prior to depositing the semiconductor layer 110, the substrate 115 can be implanted with the first dopant type followed by a second thermal diffusion process. The semiconductor layer 110 and the substrate 115 are configured such that the concentration of first dopant type in the substrate 115 is higher than the concentration of first dopant type in the semiconductor layer 110.

To minimize the number of times the device 100 is exposed to thermal cycles, the first and second thermal processes can be applied as a single thermal process after implanting all of the desired dopants into the semiconductor layer 110 or substrate 115 and, in some cases, after forming the insulating trench. After diffusing the dopants, there can be a gradient zone 127 within the substrate 115 that has a gradually increasing concentration gradient of the first dopant type as one moves from the semiconductor layer 110 towards the substrate 115.

FIG. 1 also shows selected steps in the formation of first and second transistor devices 130, 132 in or on the substrate 115 or, in some cases, in or on the semiconductor layer 110. The transistor devices 130, 132 can be one or more MOS transistors (e.g., pMOS, nMOS or CMOS transistors), bipolar transistors, or other conventional transistors, or two-terminal devices such as diodes, capacitors, resistors. The transistor devices 130, 132 can be formed as part of forming a BiCMOS device 135 (e.g., a linear BiCMOS device) having such transistors 130, 132. U.S. Pat. No. 4,994,887 to Hutter et al. ("Hutter"), incorporated by reference in its entirety, provides example processes for forming such BiCMOS devices. One skilled in the art would be aware of alternative processes for forming BiCMOS devices and the various configurations BiCMOS devices can have.

FIG. 1 shows selected steps in the formation of example first and second transistors 130, 132 configured as a MOS transistor and bipolar transistor, respectively. FIG. 1 shows the device after forming a doped buried layer 140 by implanting a second dopant type into the substrate 115 (e.g., the second dopant type is an n-type dopant when the first dopant type is an p-type dopant), followed by a thermal diffusion process. In some embodiments the doped buried layer 140 is an n-type dopant buried layer 140 (NBL). FIG. 1 further shows the device 100 after forming well regions 150, 152 on the substrate 115 by implanting second dopant types (e.g., n-type dopants) into the semiconductor layer 110. As shown in FIG. 1, some well regions 150 can serve as the well for a MOS transistor 130 (e.g., a PMOS transistor), while other well regions 152 can serve as the deep-n well (DEEPN) for the bipolar transistor 132.

FIG. 1 also shows the device 100 after forming a second well region 160 in the semiconductor layer 110 such that the second well region 160 (e.g., a deep n-well, DNWELL) is formed adjacent to at least one of the well regions 152. In some cases, the amount of second dopant type implanted into the well region 152 is greater than the amount of second dopant type implanted into the second well region 160 (e.g., the DEEPN well region 152 is n++, while the DNWELL second well region 160 is n−). In such embodiments, the second well region 160 (DNWELL) can be configured as a collector of a bipolar transistor device 132. Forming the doped buried layer 140, the well regions 150, 152 and second well region 160 can include separate thermal processes or be combined with a single thermal process.

FIG. 1 further shows the device 100 after forming a doped surface layer 165 of the bipolar transistor 132 within the well region 152, where the doped surface layer 165 is doped with the first dopant type. E.g., the doped surface layer 165 can be a p-type doped layer of a bipolar transistor 132. The doped surface layer 165 can further include an emitter layer 170 (e.g., a second dopant type such as an n-dopant) and a base layer 175 (e.g., a first dopant type such as a p-dopant). Conventional dopant implantation processes can be performed to form source and drain regions 180 of the MOS transistor 130.

Figure 2:
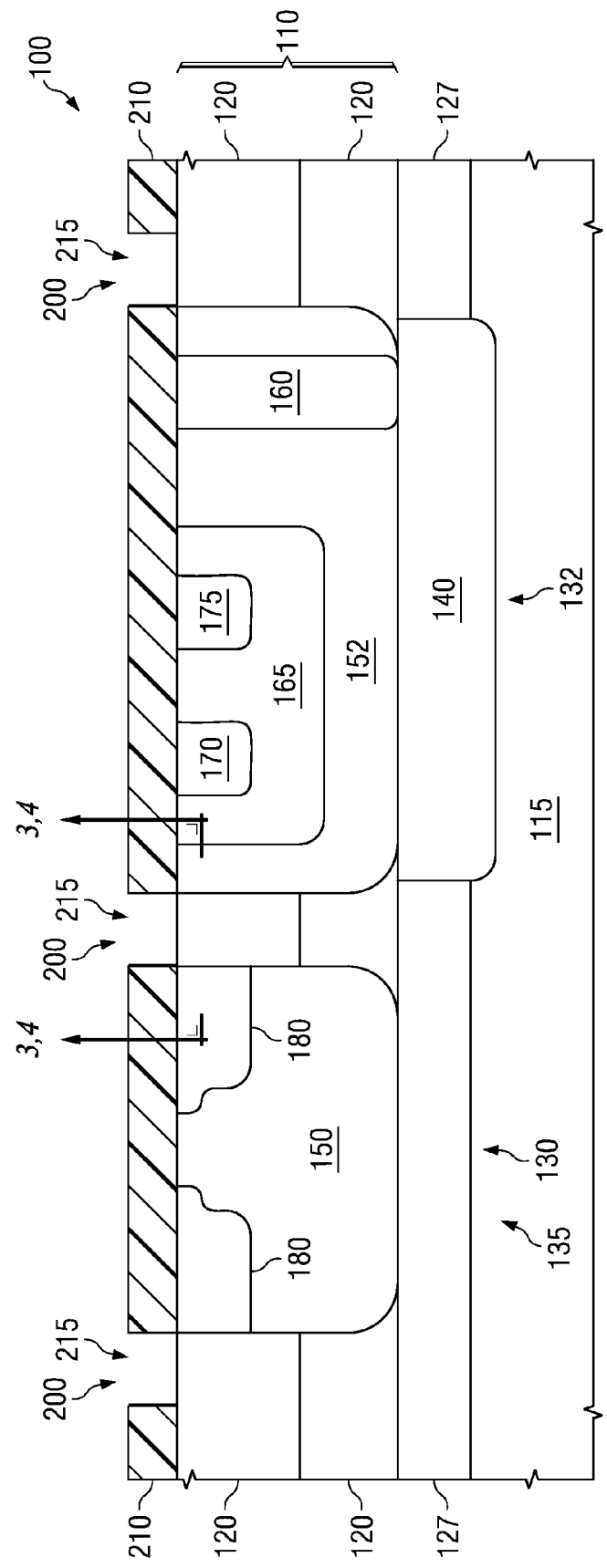

FIGS. 2-9 show selected steps in forming an insulating trench 200 of the device 100. FIG. 2 shows a cross-sectional view of the example device 100 after depositing a photoresist layer 210 on the substrate 115 and after developing the photoresist layer 210 (e.g., by exposure to ultraviolet or visible light) to form openings 215 as part of forming the trench 200.

Figure 3:
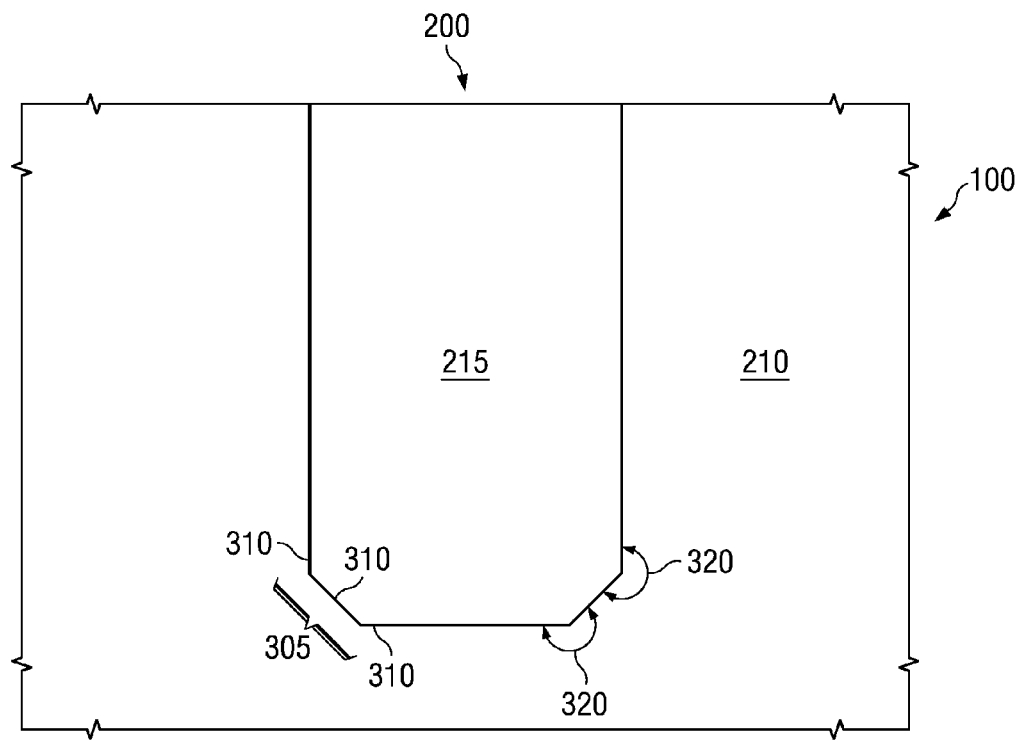
Figure 4:
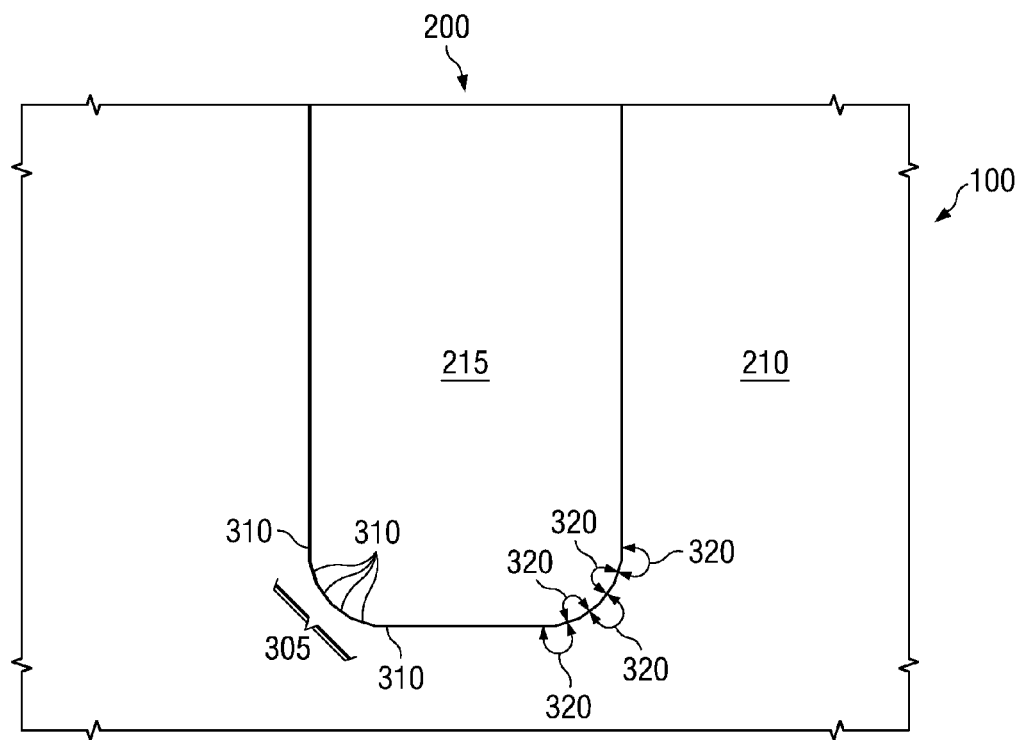

FIGS. 3 and 4 show plan views (along view line 3,4-3,4 in FIG. 2) of different embodiments of the developed photoresist layer 210 that defines the trench's corner. Forming the insulating trench 200 includes forming a corner template portion 305 in the photoresist layer 210 to define a rounded trench corner. The photolithographic mask used to develop the layer 210 is shaped to approximate rounded trench corners as a plurality of adjacent and intersecting planar edges, which in turn get transferred into the corner template portion 305 when the layer 210 is developed.

The portion 305 has at least three edges 310, where adjacent edges 310 form an exterior angle 320 of between about 270 and 180 degrees (with a corresponding interior angle of between about 90 and 180 degrees). In some cases, as shown in FIG. 3, the portion 305 has three edges 310 and the exterior angle 320 between adjacent edges 310 equals about 225 degrees (with a corresponding interior angle that equals about 135 degrees). E.g., the portion 305 of the developed photoresist layer 210 corresponds to a quarter sector of an octagon having three patterned edges 310, the adjacent edges 310 forming interior angles of about 135 degrees.

In other cases, as shown in FIG. 4, the portion 305 has six edges 310 and the exterior angle 320 between adjacent edges 310 equals about 295 degrees (with a corresponding interior angle 320 between adjacent edges 310 that equals about 165 degrees. E.g., the portion 305 of the developed photoresist layer 210 corresponds to a quarter sector of a 24-sided polygon having six patterned edges 310, the adjacent edges 310 forming interior angles 320 of about 165 degrees. Using a corner template portion 305 with six edges 310 (FIG. 4) is more desirable than three edges 310 (FIG. 3) because the former facilitates forming a closer approximation to a smoothly rounded trench corner than the latter. One skilled in the art would understand that other numbers of edges 310 and interior angles 320 could be used.

Figure 5:
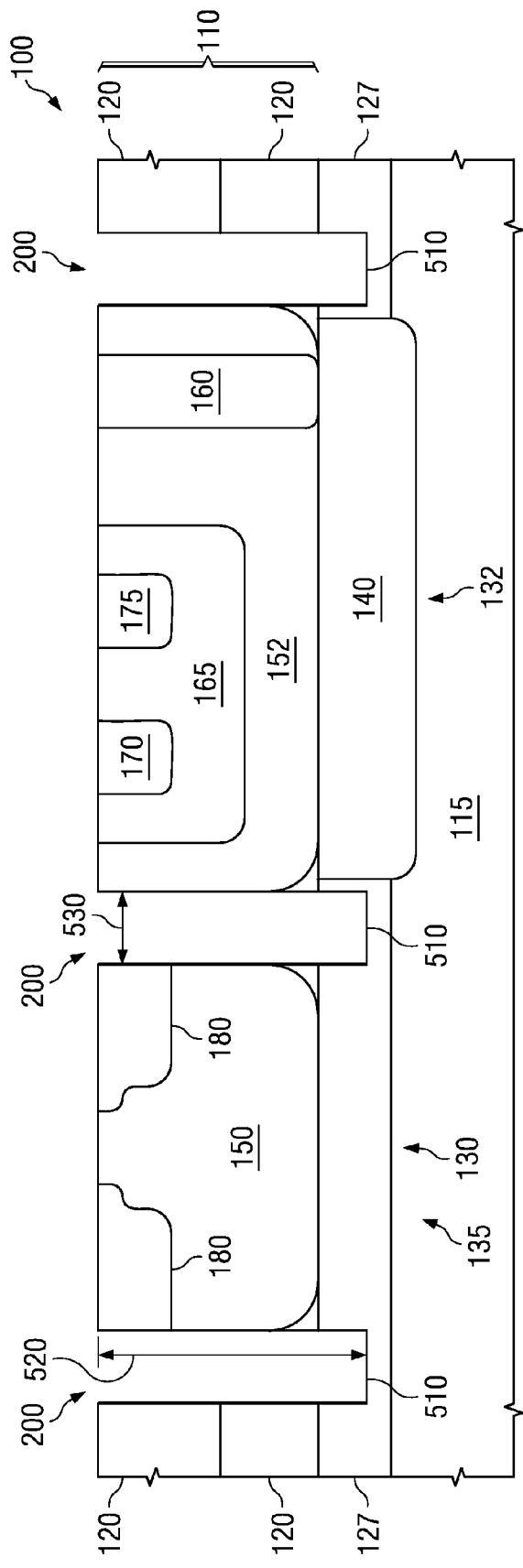

FIG. 5 shows a cross-sectional view of the device 100 after patterning the substrate 115 to form the insulating trench 200 and after removing the photoresist layer 210. Patterning can include a dry etch process such as reactive ion etching. As illustrated in FIG. 5, the trench 200 is located between the first and second transistor devices 130, 132. Although a plurality of such trenches 200 can be formed between the transistor devices 130, 132, and, in some cases, it is preferable to form a single trench 200. Forming a single trench minimizes the amount of area occupied by the trench, thereby facilitating the formation of a higher density of devices 130, 132 on the substrate 115.

As further illustrated in FIG. 5, to improve isolation against lateral carrier transfer, some embodiments of the trench 200 are formed deeply into the substrate 115. For instance, some preferred embodiments of the trench 200 pass through the semiconductor layer 110 and into the substrate 115. E.g., the trench 200 is formed through the semiconductor layer 110 such that a bottom side 510 of the insulating trench 200 ends in the substrate 115. E.g., when the semiconductor layer 110 has a thickness 125 (FIG. 1) of about 20 microns, the trench has a depth 520 of greater than about 20 microns. Some embodiments of the trench 200 have a width of about 1 to 3 microns.

Figure 6:
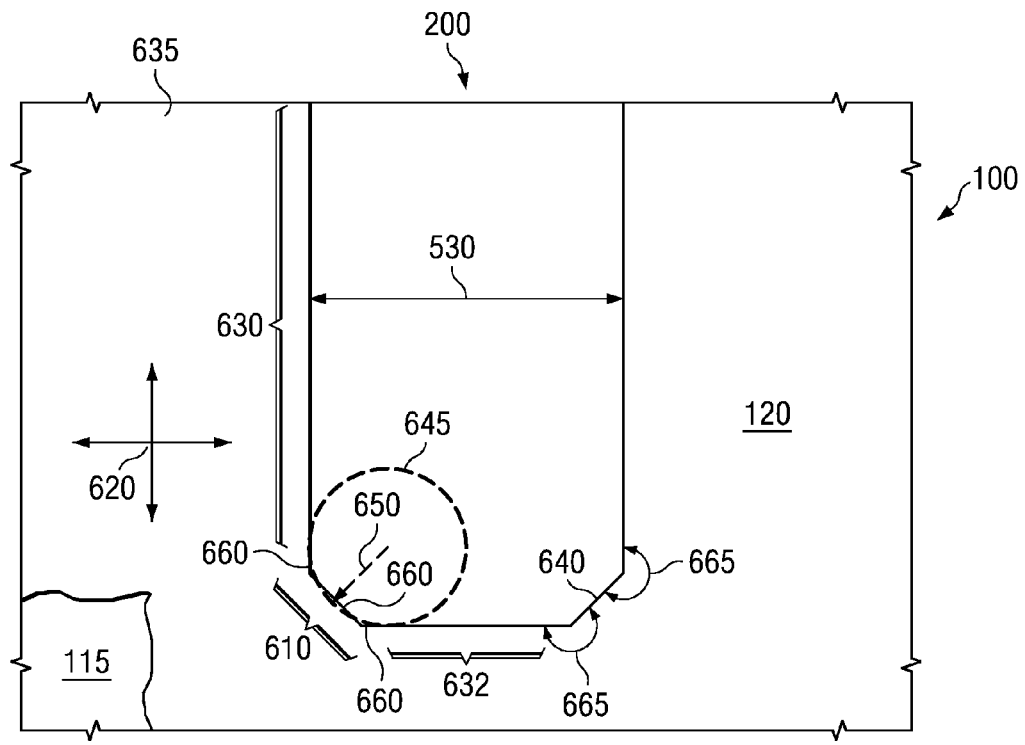
Figure 7:
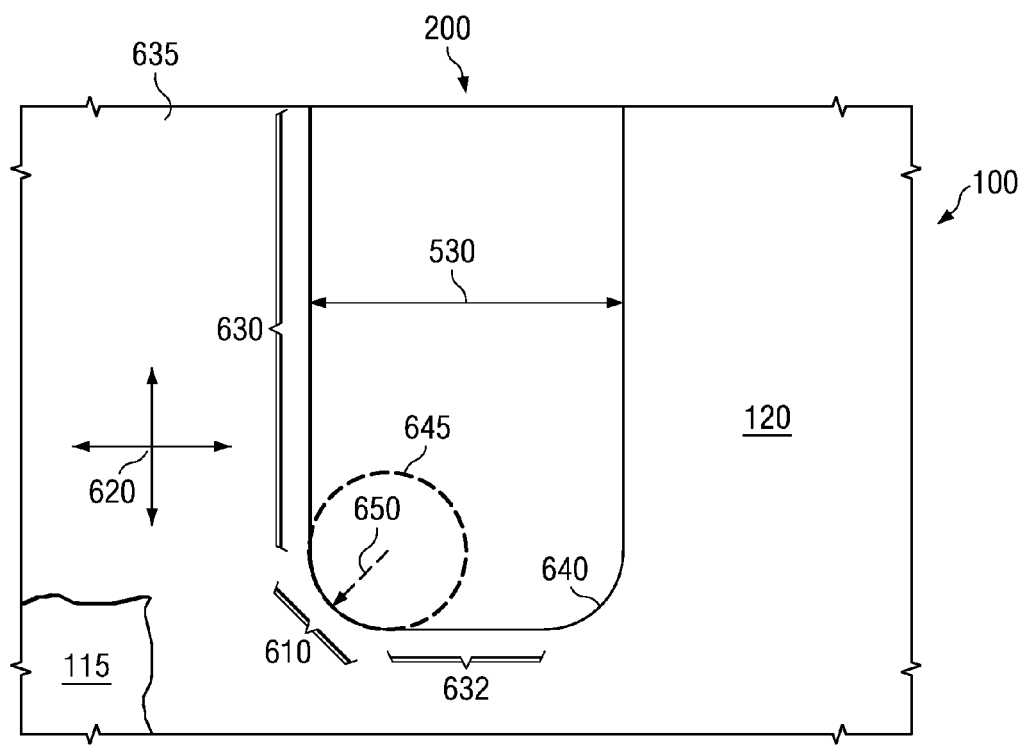

FIGS. 6 and 7 show plan views of the example devices 100 analogous to those shown in FIGS. 3 and 4, respectively, but after patterning the substrate 115 and removing the photoresist layer 210. As illustrated in FIG. 6, at least one top corner 610 of the insulating trench 200 is a rounded corner in a lateral plane 620 of the substrate 115 (or semiconductor layer 110). The term top corner 610 as used herein refers to that portion of the insulating trench 200 located between two perpendicular linear portions 630, 632 of the insulating trench 200 and located at the substrate (or semiconductor layer 110) surface 635. The term rounded corner, as used herein, refers to an interior surface 640 of the top corner 610 that forms a circular arc 645. In some embodiments, the circular arc 645 is defined by a radius of curvature 650 of about 1 micron or greater. In some cases, the radius of curvature 650 is adjusted depending upon the width 530 (FIG. 5) of the insulating trench 200. E.g., consider when the insulating trench's width 530 ranges from about 0.5 to 3 microns, then the radius of curvature 650 ranges from about 0.5 to 3 microns.

In some cases, such as shown in FIG. 6, the developed photoresist edges 310 (FIG. 3) are patterned into the top corner 610 of the insulating trench 200. E.g., the top corner 610 can have three or more trench edges 660 with interior angles 665 between about 90 and 180 degrees. In some cases, e.g., the rounded top corner 610 has a shape that corresponds to a one-quarter sector of an octagon or of a 24-sided regular polygon having three or six adjacent insulating trench edges 660 with interior angles 665 of about 135 and 165 degrees, respectively. In other cases, however, the developed photoresist edges 310 are not patterned into the top corner 610 of the insulating trench 200 because the dry etch process used for patterning tends to smooth out planarities in the trench edges 660. In such cases the corner 610 forms a smooth arc with no discernable transitions between edges 660.

As the number of edges 310 in the photoresist layer 210 (FIG. 3) is increased, the patterning process is more effective at smoothing the top corner 610 to form a rounded corner. E.g., for the device 100 shown in FIG. 7, patterning results in the top corner 610 of the insulating trench 200 having an interior surface 640 with a smooth arc that is free of discernable trench edges.

Figure 8:
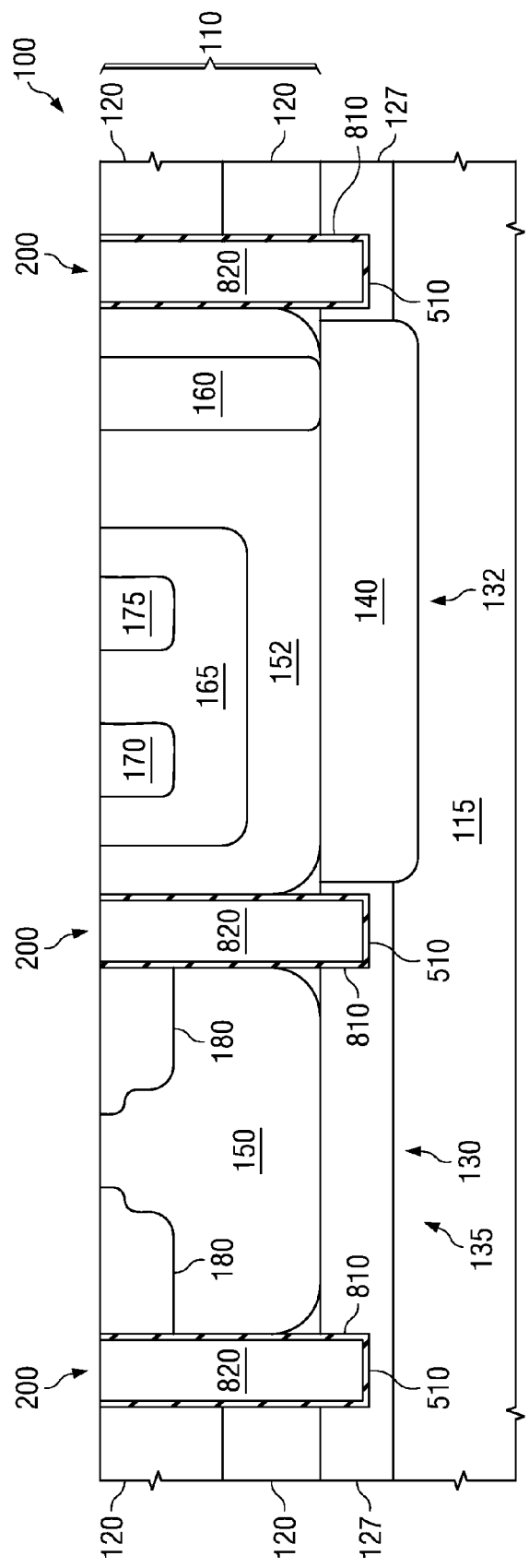

FIG. 8 shows a cross-sectional view of the device 100 shown in FIG. 5 after filling the trench 200. In some cases the trench 200 is entirely filled with an insulating material 810 (e.g., silicon oxide and silicon nitride) using chemical vapor deposition (CVD) or another conventional deposition process. In other cases, such as shown in FIG. 8, a conformal coating of the insulating material 810 (e.g., thermal silicon oxide) is formed in the trench 200. The interior of the trench 200 is then filled with a material 820 whose thermal expansion coefficient closely matches (e.g., within about 10 percent) that of the semiconductor layer 110 and substrate 115. E.g., the material 820 can include a conductive material such as polysilicon when the semiconductor layer 110 and substrate 115 comprise epitaxially-grown silicon and a silicon wafer, respectively. Filling the trench 200 with a material 820 having such thermal properties is desirable because this makes the trench less prone to cracking when the device is subjected to thermal processes. It can be difficult, however, to deposit a void-free coating of insulating material 810 and a void-free filling of conductive material 820 in the trench 200 when the trench's width 530 is about 1 micron or less and its depth 520 is about 20 microns or greater (FIG. 5). In such cases, it can be advantageous for the trench 200 to be entirely filled with the insulating material 810. Insulating material 810 and conducting material 820 outside of trench 200 can be removed using known processes.

Figure 9:
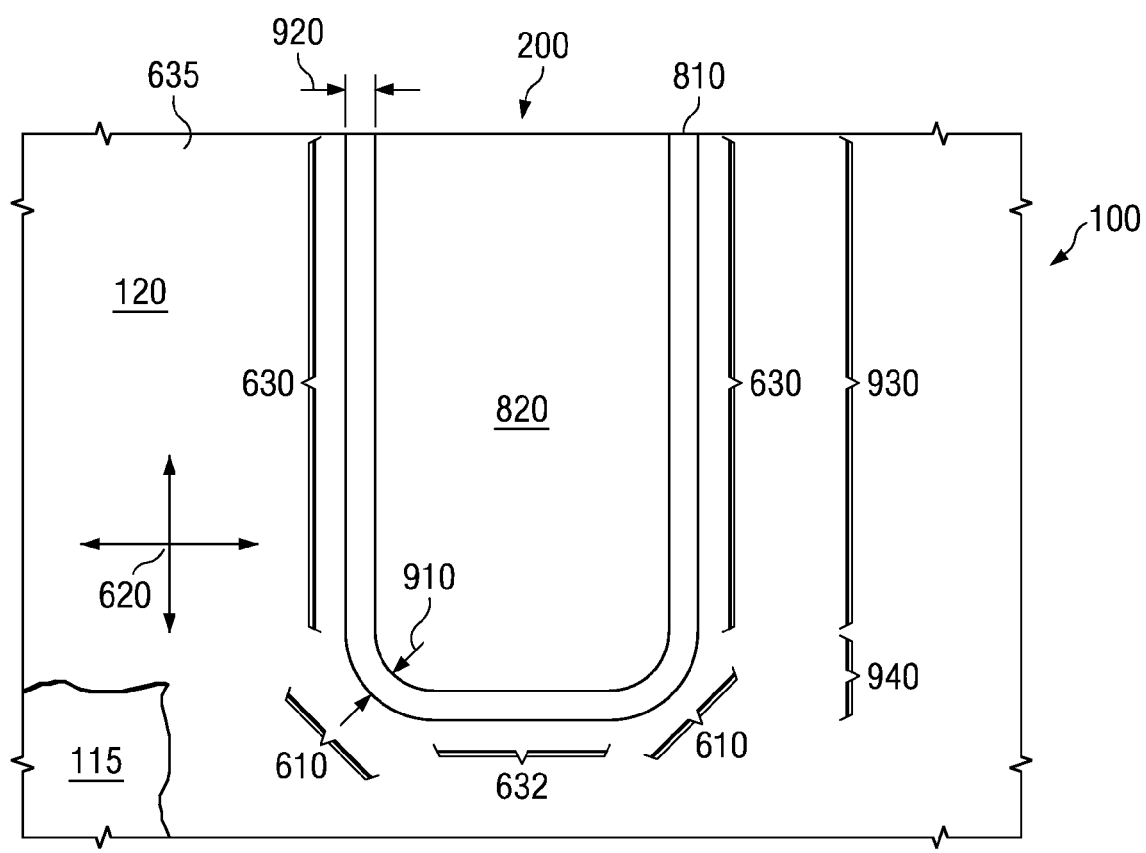

FIG. 9 shows a plan view of an example device 100 at the same stage of manufacture as shown in FIG. 8 and analogous to the device shown in FIG. 7. The trench 200 is shown after depositing a conformal coating of the insulating material 810 in the trench, and filling the trench's interior with the thermally matching material 820. Having at least one, and preferably all, of the top corners 610 configured as rounded corners helps to prevent the formation of voids during the deposition of materials 810, 820 in the trench 200. Rounded top corners 610 also help to prevent the formation of cracks in the insulating material 810 when the device 100 is subject to a thermal process. Because the top corners 610 are rounded, a thickness 910 of the conformal coating of insulating material 810 deposited at the rounded corner 610 is substantially equal to (e.g., within 10 percent of) a thickness 920 of the insulating material 810 deposited at linear portions 630 of the trench 200. Having a substantially same thickness 910 deters crack formation at the corners 610 because the insulating material 810 in the corners 610 is not subjected to greater thermally-induced stresses than the insulating material 810 at linear portions 630 of the trench 200.

Figure 10:
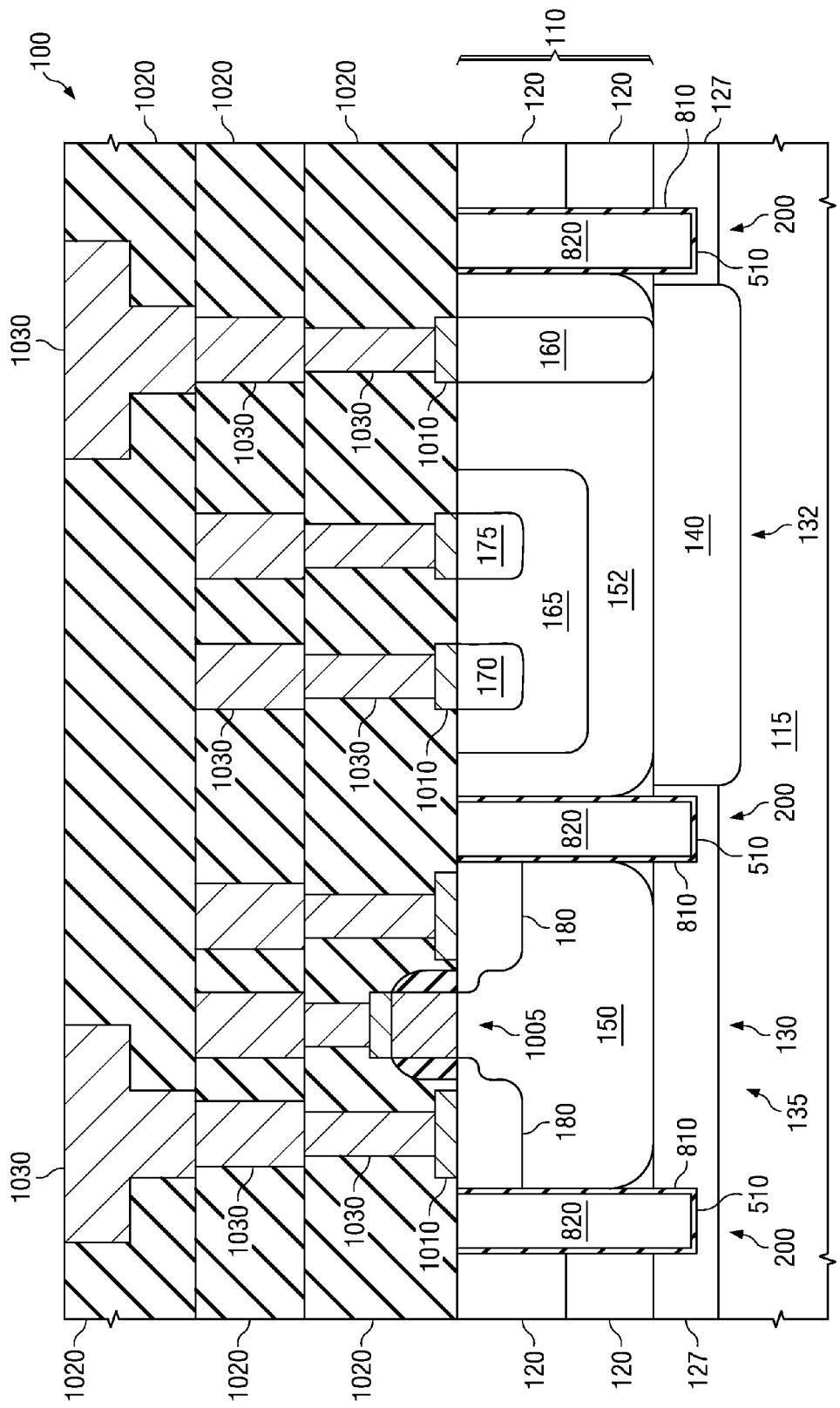

FIG. 10 shows a cross-sectional view of the device 100 shown in FIG. 1 after forming a gate structure 1005 of the MOS transistor 130, and transistor contacts 1010. FIG. 10 also shows the device 100, after depositing insulating layers 1020 (e.g., pre-metal and interlayer dielectric layers) on the substrate 115 and covering the transistors 130, 132 (e.g., the BiCMOS device 135). FIG. 10 also shows the device after forming interconnects 1030 (e.g., lines, via, trenches including single or dual damascene structures, or other conventional interconnect structures) through one or more of the insulating layers 1020 to electrically connect the first and second transistors 130, 132 to each other, or to active (e.g., other transistors) or passive devices (resistors, inductors, capacitors, diodes) of the device 100.

FIG. 10 also illustrates another embodiment, the semiconductor device 100 itself. Embodiments of the device 100 can be configured as an integrated circuit semiconductor device. Any of the above-described methods of manufacture can be used to fabricate the device 100 and the device 100 can comprise any of the above-discussed embodiments of its components structures.

For instance, the semiconductor device 100 can comprise first and second transistor devices 130 (each device including one or more MOS or bipolar transistors) on or in the semiconductor layer 110. The device 100 also includes an insulating trench 200 located between the devices 130, 132. At least one upper corner 610 of the insulating trench 200 is a rounded corner in a lateral plane 620 of the substrate 115. Some embodiments of the device 100 can include a BiCMOS device 135 that includes semiconductor layer 110, transistors 130, 132, and trench 200. Some embodiments of the device 100 can include the above-described insulating layers 1020 and interconnects 1030.

Some embodiments of the trench 200 are formed through the semiconductor layer 110 and a bottom side 510 of the trench 200 ends in the substrate 200. The depth 520 to which the trench is formed is carefully selected to optimize the ability of the trench 200 to deter the transfer of carriers from one device 130 to another device 132. By forming a sufficiently deep trench 200, the potential to encounter a latch-up phenomenon during the operation of the device 100 can be reduced.

For instance, in some embodiments, the bottom side 510 of the trench 200 stops at a depth 520 in the substrate 115 (e.g., the gradient zone 127) where the dopant concentration in the substrate 115 is greater than an injected carrier concentration in the first transistor device 130. The specific value of such a depth 520 depends on a number of factors including the concentrations of first and second dopants in the semiconductor layer 110, the substrate 115, well region 150, and the voltage applied to the transistor device 130.

Consider the case where the first transistor device 130 includes an about 20 micron thick (see thickness 125 indicated in FIG. 1) semiconductor layer 110 having a first (e.g., p-type) dopant type concentration of about 1E15 to 5E15 atoms/cm$^3$, the substrate has a first dopant type concentration of about 1E19 to 5E19, the well region 150 has a second (e.g., n-type) dopant type concentration of about 1E16 to 1E17 atoms/cm$^3$, and about 50 to 100 Volts is applied to the device 100 (e.g., to the source region 180 of a MOS transistor 130). In such embodiments, the trench 200 is formed to a depth 520 of about 20 microns, which corresponds to a first dopant concentration of about 5E17 atoms/cm³ in the substrate 115 (e.g., in the gradient zone 127).

The insulating trench 200 can have a variety of configurations to facilitate deterring the transfer of carriers between adjacent transistor devices 130, 132. E.g., as shown for the example device 100 depicted in FIG. 9, the insulating trench 200 has a single linear segment 930, wherein the rounded upper corner 610 is located at one or both ends 940 of the single linear segment 930.

Figure 11:
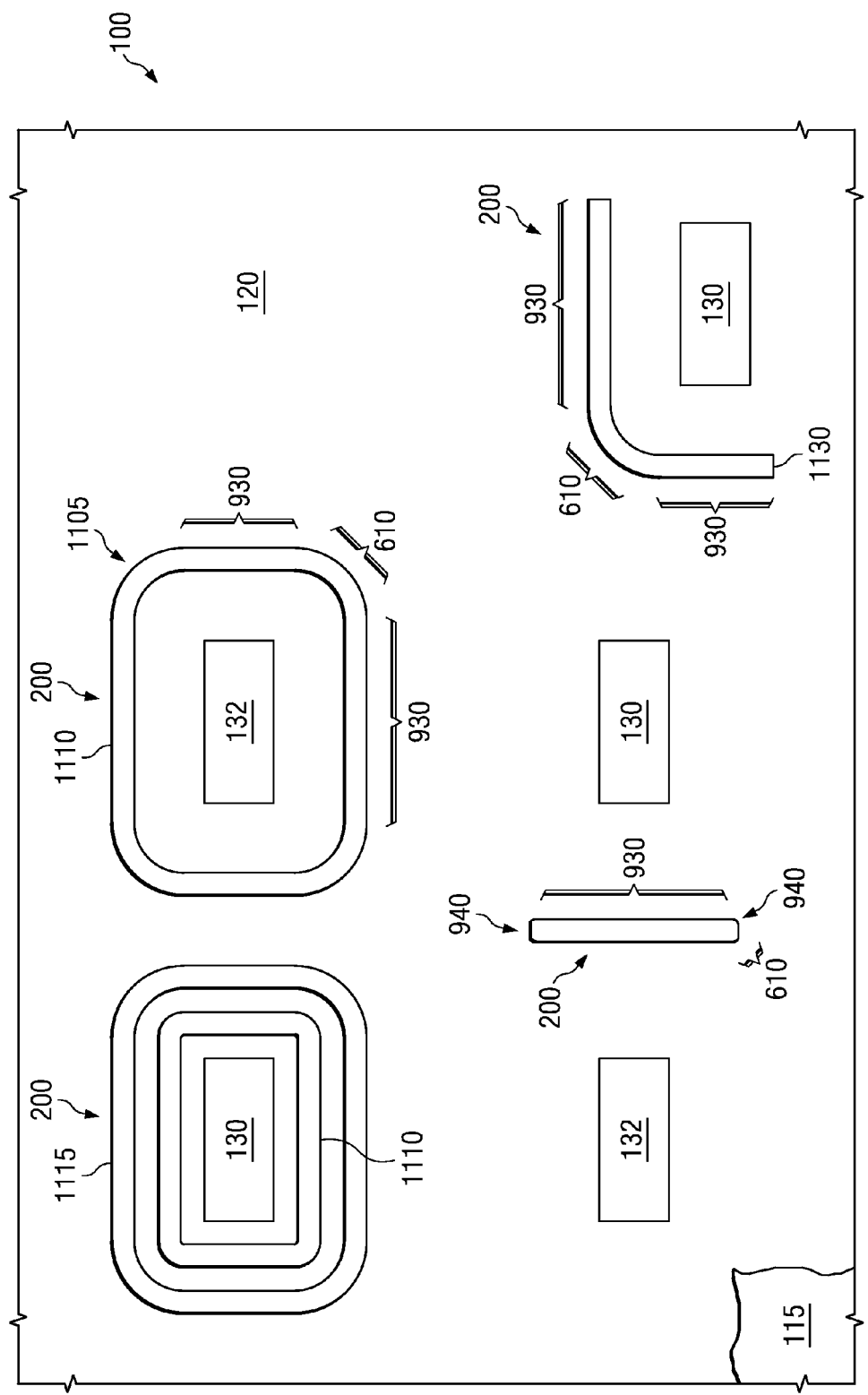
FIG. 11 presents a plan view of an example device of the disclosure that depicts various embodiments of an insulating trench of the device.

This is illustrated in FIG. 11, which presents a plan view of the device 100 analogous to FIG. 9 but at a lower magnification. For clarity, details of the transistor devices 130, 132 are not shown. However, the devices 130, 132 could each include one or more of the above-described MOS and bipolar transistor devices, or types of transistor devices. As illustrated, one embodiment of the trench 200 comprises single linear segment 930 and rounded upper corner 610 is located at one or both ends 940 of the trench 200.

As also illustrated in FIG. 11, other embodiments of the trench 200 can entirely or partially surround the transistor devices 130, 132. E.g., some embodiments of the trench 200 include four linear segments 930 that are coupled together by connecting corners 1105 to form a ring 1110 surrounding at least one of the first or second transistor devices 130, 132. At least one, and in some cases all, of the corners 1105 has the rounded top corner 610. The ring 1110 can have a rectangular, or other closed-shaped structure.

As further illustrated in FIG. 11, there can be a plurality of insulating trenches 200 located between the first and second transistor device 130, 132. In some cases, e.g., there can be a plurality of insulating trenches 200 that form concentric rings 1110, 1115 of insulating trenches 200 around one or both of said first and second transistor devices 130, 132.

As also illustrated in FIG. 11, some embodiments of the trench 200 have two perpendicular linear segments 930 that are coupled together by a connecting corner 1105 having the rounded top corner 610 to form an L-shaped structure 1130 that partially surrounds at least one of the first or second transistor devices 130, 132. Such a configuration can be advantageous when one of the transistor devices 130 is located at a corner 1130 of the substrate 115 (e.g., the corner of an integrated circuit die). Other open structures having two or more linear segments 930 and connecting corners 1105 having at least one rounded top corner 610, are also within the scope of the disclosure.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
    forming a bipolar complementary metal oxide semiconductor (BiCMOS) device including:
        forming a semiconductor layer on a semiconductor substrate, wherein said semiconductor layer and said substrate include a same first dopant type, and a concentration of said first dopant is greater in said substrate than in said semiconductor layer;
        forming a metal oxide semiconductor (MOS) transistor on or in said semiconductor layer;
        forming a bipolar transistor on or in said semiconductor layer; and
        forming an insulating trench located between said MOS transistor and said bipolar transistor, wherein said insulating trench is formed through said semiconductor layer and into said substrate and at least one top corner of said insulating trench is formed as a rounded corner in a lateral plane of said substrate;
    forming insulating layers on said substrate and covering said BiCMOS device; and
    forming interconnects through one or more of said insulating layers to electrically connect said MOS transistor and bipolar transistor to each other, or to other active or passive components of said semiconductor device;
    wherein said insulating trench is formed with four linear segments that are coupled together by connecting corners to form a ring that surrounds at least one of said MOS transistor device or said bipolar transistor device; and wherein at least one of said connecting corners has said at least one top corner.

2. The method of claim 1, wherein said insulating trench is formed so that a bottom of said insulating trench stops at a depth in said substrate where said dopant concentration is greater than an injected carrier concentration in said MOS transistor.

3. A method of manufacturing a semiconductor device, comprising:
    forming a bipolar complementary metal oxide semiconductor (BiCMOS) device including:
        forming a semiconductor layer on a semiconductor substrate, wherein said semiconductor layer and said substrate include a same first dopant type, and a concentration of said first dopant is greater in said substrate than in said semiconductor layer;
        forming a metal oxide semiconductor (MOS) transistor on or in said semiconductor layer;
        forming a bipolar transistor on or in said semiconductor layer; and
        forming an insulating trench located between said MOS transistor and said bipolar transistor, wherein said insulating trench is formed through said semiconductor layer and into said substrate and at least one top corner of said insulating trench is formed as a rounded corner in a lateral plane of said substrate;
    forming insulating layers on said substrate and covering said BiCMOS device; and
    forming interconnects through one or more of said insulating layers to electrically connect said MOS transistor and bipolar transistor to each other, or to other active or passive components of said semiconductor device;
    wherein said rounded corner is formed with a shape that corresponds to a one-quarter sector of a 24-sided regular polygon having six adjacent insulating trench edges that each form interior angles of about 165 degrees with adjacent edges.

4. A method of manufacturing a semiconductor device, comprising:
    forming a bipolar complementary metal oxide semiconductor (BiCMOS) device including:
        forming a semiconductor layer on a semiconductor substrate, wherein said semiconductor layer and said substrate include a same first dopant type, and a concentration of said first dopant is greater in said substrate than in said semiconductor layer;
        forming a metal oxide semiconductor (MOS) transistor on or in said semiconductor layer;
        forming a bipolar transistor on or in said semiconductor layer; and
        forming an insulating trench located between said MOS transistor and said bipolar transistor, wherein said insulating trench is formed through said semiconductor layer and into said substrate and at least one top corner of said insulating trench is formed as a rounded corner in a lateral plane of said substrate;

forming insulating layers on said substrate and covering said BiCMOS device; and forming interconnects through one or more of said insulating layers to electrically connect said MOS transistor and bipolar transistor to each other, or to other active or passive components of said semiconductor device;

wherein said insulating trench is formed so that a bottom of said insulating trench stops at a depth in said substrate where said dopant concentration is greater than an injected carrier concentration in said MOS transistor; and wherein said depth corresponds to a first dopant type concentration of about $5E17$ atoms/cm$^3$ in said substrate when:

said MOS transistor is formed with a doped well in said semiconductor layer, and said doped well includes a second dopant type with a concentration of about $1E16$ to $1E17$ atoms/cm$^3$;

a voltage of about 50 to 100 Volts is applied to said MOS transistor;

said semiconductor layer is formed with said first dopant concentration of about $1E15$ to $5E15$ atoms/cm$^3$; and said substrate has said first dopant type concentration of about $1E19$ to $5E19$ atoms/cm$^3$.

5. The method of claim 4, wherein said insulating trench is formed in a ring configuration that surrounds one of said MOS transistor or said bipolar transistor.

6. The method of claim 4, further including conformably coating said insulating trench with an insulating material, wherein a thickness of said insulating material is provided at said rounded corner that is substantially equal to a thickness of said insulating material provided in linear portions of said insulating trench.

7. The method of claim 4, wherein said insulating trench is formed with a linear segment and said rounded corner is located at one or both ends of said linear segment.

8. The method of claim 4, wherein said insulating trench is formed with two perpendicular linear segments that are coupled together by a connecting corner having said rounded corner.

9. The method of claim 4, wherein said rounded top corner is formed to have an interior surface that defines a circular arc having a radius of curvature of about 1 micron or greater.

10. The method of claim 4, wherein forming said semiconductor layer includes forming a plurality of epitaxial polysilicon layers.

11. The method of claim 4, wherein said semiconductor layer is formed to a thickness of about 15 to 25 microns.

12. The method of claim 4, wherein said semiconductor layer is formed to a thickness of 20 microns or less; and said insulating trench is formed with a depth of 20 microns or greater, and a width of about 1 micron or less; and said insulating trench is substantially filled with an insulating material.

13. A method of manufacturing a semiconductor device, comprising:

depositing a semiconductor layer on a semiconductor substrate;

forming a bipolar complementary metal-oxide-semiconductor device, including:

forming a first transistor device and second transistor device in or on said semiconductor layer; and forming an insulating trench through said semiconductor layer such that a bottom side of said insulating trench ends in said substrate, wherein said insulating trench is located between said first and second transistor devices and at least one top corner of said insulating trench is a rounded corner in a lateral plane of said substrate;

depositing insulating layers on said substrate and covering said bipolar complementary metal-oxide-semiconductor device; and forming interconnects through one or more of said insulating layers to electrically connect said first and second transistors to each other, or to other transistors of said semiconductor device;

wherein forming said insulating trench includes developing a portion of a photoresist layer for said at least one top corner to have at least three edges, wherein adjacent edges of said portion form an interior angle of between about 90 and 180 degrees.

14. A method of manufacturing a bipolar complementary metal oxide semiconductor (BiCMOS) device, comprising:

forming a semiconductor layer on a semiconductor substrate, wherein said semiconductor layer and said substrate include a same first dopant type, and a concentration of said first dopant is greater in said substrate than in said semiconductor layer;

forming a metal oxide semiconductor (MOS) transistor on or in said semiconductor layer;

forming a bipolar transistor on or in said semiconductor layer; and forming an insulating trench located between said MOS transistor and said bipolar transistor, wherein said insulating trench is formed through said semiconductor layer and into said substrate and at least one top corner of said insulating trench is formed as a rounded corner in a lateral plane of said substrate;

wherein said insulating trench is formed so that a bottom of said insulating trench stops at a depth in said substrate where said dopant concentration is greater than an injected carrier concentration in said MOS transistor; and wherein said depth corresponds to a first dopant type concentration of about $5E17$ atoms/cm$^3$ in said substrate when:

said MOS transistor is formed with a doped well in said semiconductor layer, and said doped well includes a second dopant type with a concentration of about $1E16$ to $1E17$ atoms/cm$^3$;

a voltage of about 50 to 100 Volts is applied to said MOS transistor;

said semiconductor layer is formed with said first dopant concentration of about $1E15$ to $5E15$ atoms/cm$^3$; and said substrate has said first dopant type concentration of about $1E19$ to $5E19$ atoms/cm$^3$.

\* \* \* \* \*